United States Patent
Kim et al.

(10) Patent No.: US 10,691,163 B2
(45) Date of Patent: Jun. 23, 2020

(54) DISPLAY DEVICE

(71) Applicant: LG DISPLAY CO., LTD., Seoul (KR)

(72) Inventors: Donghoon Kim, Seoul (KR); WonSeok Choi, Goyang-si (KR); Taecheol Kang, Asan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 99 days.

(21) Appl. No.: 15/590,244

(22) Filed: May 9, 2017

(65) Prior Publication Data

US 2017/0344053 A1 Nov. 30, 2017

(30) Foreign Application Priority Data

May 30, 2016 (KR) .......................... 10-2016-0066452

(51) Int. Cl.
*G06F 1/16* (2006.01)
*H01L 51/52* (2006.01)
(Continued)

(52) U.S. Cl.
CPC .......... *G06F 1/1601* (2013.01); *G02F 1/0102* (2013.01); *G06F 1/1637* (2013.01);
(Continued)

(58) Field of Classification Search
CPC .................. G06F 1/1637; G06F 1/1601; G02F 1/133308; G02F 1/133305; G02F 1/0102;
(Continued)

(56) References Cited

U.S. PATENT DOCUMENTS

| | | | | |
|---|---|---|---|---|
| 7,014,964 B1* | 3/2006 | Hsu | ......................... | G02B 5/201 |
| | | | | 427/162 |
| 2007/0269076 A1* | 11/2007 | Honda | ...................... | H04R 9/00 |
| | | | | 381/411 |
| 2011/0175070 A1* | 7/2011 | Kim | ..................... | H01L 51/0096 |
| | | | | 257/40 |

(Continued)

FOREIGN PATENT DOCUMENTS

| | | |
|---|---|---|
| CN | 101309842 A | 11/2008 |
| CN | 102456845 A | 5/2012 |

(Continued)

OTHER PUBLICATIONS

Office Action with English translation dated Oct. 15, 2018 issued in the corresponding Chinese Patent Application No. 201710395715.5, pp. 1-12.

(Continued)

*Primary Examiner* — Jimmy H Nguyen
(74) *Attorney, Agent, or Firm* — Polsinelli PC

(57) ABSTRACT

Disclosed aspects relate to a display device. By forming a back cover, which is the support structure constituting the display device, in a bent structure and forming a molding part made of an elastic material to enclose the vertical extension portion, a border gap, which is a clearance between the side surfaces of the display panel and the side surface support structure, can be minimized to maintain an excellent external appearance of the display device, and to prevent infiltration of foreign matter and damage of the display panel, which may be caused by the gap between the display panel and the support structure. By disposing a metal inner plate on the inner surface of the horizontal portion of the back cover, the rigidity of the back cover can be increased, the thickness of the back cover can be decreased, and heat generated from the display panel and the like can be smoothly dissipated.

18 Claims, 11 Drawing Sheets

(51) Int. Cl.
*G02F 1/01* (2006.01)
*H01L 27/32* (2006.01)
*G02F 1/1333* (2006.01)

(52) U.S. Cl.
CPC ........ H01L 51/529 (2013.01); H01L 51/5243 (2013.01); H01L 51/5246 (2013.01); H01L 51/5253 (2013.01); *G02F 1/133308* (2013.01); *H01L 27/3213* (2013.01); *H01L 51/5281* (2013.01)

(58) Field of Classification Search
CPC ........ G02F 2001/133314; G02F 2001/133322; G02F 2001/133325; H01L 51/5253; H01L 51/5246; H01L 51/529; H01L 51/5243; H01L 51/5281; H01L 27/3213
See application file for complete search history.

(56) References Cited

U.S. PATENT DOCUMENTS

| | | | | |
|---|---|---|---|---|
| 2012/0113348 A1* | 5/2012 | Wang | ................ | G02F 1/133615 349/58 |
| 2012/0162880 A1* | 6/2012 | Yoon | ........................ | H04N 5/64 361/679.01 |
| 2014/0043560 A1* | 2/2014 | Jang | ........................ | H05K 5/02 349/58 |
| 2014/0160694 A1 | 6/2014 | Yoon et al. | | |
| 2014/0176869 A1* | 6/2014 | Lee | ................... | G02F 1/133615 349/65 |
| 2015/0103286 A1* | 4/2015 | Cho | ................... | G02F 1/133308 349/58 |

FOREIGN PATENT DOCUMENTS

| | | |
|---|---|---|
| CN | 102474580 A | 5/2012 |
| CN | 103814403 A | 5/2014 |
| CN | 104345491 A | 2/2015 |

OTHER PUBLICATIONS

Office Action dated May 13, 2019 issued in a corresponding Chinese Patent Application No. 201710395715.5 9 pages.

* cited by examiner

DISPLAY DEVICE

CROSS REFERENCE TO RELATED APPLICATION

This application claims priority from Korean Patent Application No. 10-2016-0066452, filed on May 30, 2016, which is hereby incorporated by reference for all purposes as if fully set forth herein.

BACKGROUND

Field of the Disclosure

The present disclosure relates to a display device, and, more particularly, to a display device that includes a back cover, which is a back support structure of the display device and a molding part formed of an elastic material which surrounds a vertical extension portion of the back cover, so that the infiltration of foreign matter, damage of a display panel, and the like, which may be caused due to a gap between the display panel and the support structure, can be prevented.

Description of the Background

As mobile electronic devices, such as mobile communication terminals and notebook computers, have been developed, there is an increasing demand for flat panel display devices applicable thereto.

As the flat panel display devices, for example, a liquid crystal display device, a plasma display panel, a field emission display device, a light emitting diode display device, and an organic light emitting diode display device are being studied.

Among these display devices, the liquid crystal display device (LCD) includes an array substrate including thin film transistors, an upper substrate including a color filter and/or a black matrix, and a liquid crystal material layer formed therebetween. The alignment state of the liquid crystal layer is adjusted according to an electric field applied between opposite electrodes of a pixel region and thus the transmittance of light is adjusted, thereby displaying an image.

The display panel of such a liquid crystal display device is defined as a display area providing an image to the user (Active Area (AA)) and a non-display area (Non-active Area (NA)), which is a peripheral area of the display area AA. The display panel is typically fabricated by bonding a first substrate, which is an array substrate on which thin film transistors or the like are formed so that a pixel area is defined, and a second substrate, which serves as an upper substrate on which a black matrix and/or a color filter layer are formed.

The array substrate or the first substrate on which the thin film transistors are formed further includes a plurality of gate lines GL extending in a first direction and a plurality of data lines DL extending in a second direction perpendicular to the first direction, and one pixel area (P) is defined by one gate line and one data line. At least one thin film transistor is formed in one pixel area (P), and the gate or source electrode of each thin film transistor may be connected to a gate line and a data line.

Of these flat panel display devices, the liquid crystal display device is a device that does not have a self light-emitting element, and thus requires a separate light source. Accordingly, a backlight unit having a light source, such as an LED, is provided on the rear surface to irradiate light toward the front surface of the liquid crystal panel, and a distinguishable image is implemented through the backlight unit.

Meanwhile, an organic light emitting diode display device that has been recently spotlighted as a display device has advantages in that by using self light-emitting Organic Light Emitting Diodes (OLEDs), response speed is high, light emitting efficiency is high, and a viewing angle is wide.

When the organic light emitting display device uses a self light-emitting device, it is not necessary to use a backlight used in a liquid crystal display device using a non-light emitting device, so that the weight and thickness of the display device can be reduced. Further, the organic light emitting display device is superior to the liquid crystal display device in better viewing angle and contrast ratio, and is also advantageous in view of power consumption. The organic light emitting display device is advantageous in that it can be driven by a low DC voltage and has a high response speed. Further, the organic light emitting diode display device is resistant to external impacts, and has a wide temperature range for use since its internal components are solid. In particular, the organic light emitting diode is also advantageous in that its manufacturing cost is low.

Such an organic light emitting diode display may display an image in the form of a top emission method or a bottom emission method depending on the structure of an organic light emitting element that includes a first electrode, a second electrode, and an organic light emitting layer. In the bottom emission method, visible light generated from the organic light emitting layer is displayed on the bottom side of the substrate on which a transistor is formed. On the contrary, the top emission method displays visible light generated form the organic light emitting layer toward the top side of the substrate on which a transistor is formed.

Such an organic light emitting diode display device includes subpixels that include organic light emitting diodes that are arranged in a matrix form, and controls the brightness of the subpixels selected by scan signals according to the gradation of data. Further, the organic light emitting diode display device is a self light-emitting element, and has low power consumption, high response speed, high luminous efficiency, high luminance, and a wide viewing angle.

Such a display device or a set device includes a support structure for supporting a liquid crystal display panel or an organic light emitting display panel from the rear side. Since the support structure should form an outer appearance of a display device so as to protect the display panel, it is necessary to secure a certain level of rigidity. In particular, in order to ensure the expansion and assembly convenience of the display panel, a border gap should be formed between the display panel and the support structure that surrounds the side surfaces of the display panel.

However, foreign matter or moisture may infiltrate into the display device through the border gap between the display panel and the support structure that supports the side surfaces of the display panel, which may cause a defect. Such a gap is exposed to the external appearance of the display device, which also has a bad influence on the beauty of a product.

Therefore, there is a demand for a structure capable of minimizing the border gap between the display panel and the support structure that supports the side surfaces of the display panel.

SUMMARY

Accordingly, the present disclosure has been made in order to solve the above-described problems in the related art, and an object of the present disclosure is to provide a display device in which a back cover, which is a support structure constituting the display device, is formed in a bent structure, and a molding part made of an elastic material is formed to enclose a vertical extension portion, so that it is possible to prevent infiltration of foreign matter and the damage of the display panel which are caused due to a gap between the display panel and the support structure.

Another aspect of the present disclosure is to provide a display device in which a vertical extension portion is formed on a back cover which is a back support structure of the display device, and an elastic material molding part is formed to enclose the vertical extension portion in a state in which an uneven portion or a through hole is formed in the vertical extension portion, so that the bonding force between the back cover and the molding part can be increased.

Another aspect of the present disclosure is to provide a display device comprising a display panel, a back cover having a horizontal portion covering a rear side of the display panel, and a vertical extension portion vertically extended from the horizontal portion, and a panel protecting part having vertical and horizontal segments, the vertical segment vertically surrounding the vertical extension portion of the back cover and the horizontal segment horizontally extended from the vertical segment filling a gap between the display panel and the horizontal portion of the back cover.

Still another aspect of the present disclosure is to provide a display device in which a vertical extension portion is formed on a back cover which is a back support structure of the display device, a molding part is formed of an elastic material to enclose the vertical extension portion, and an inner plate of a metal material is disposed on the inner surface of a horizontal portion of the back cover, so that the rigidity of the back cover can be increased and heat generated from the display panel and the like can be dissipated smoothly.

In order to achieve the above-described objects, a display device according to an embodiment disclosed here may include: a display panel; a back cover including a horizontal portion configured to cover a rear side of the display panel, and a vertical extension portion bent to extend from the horizontal portion; and a molding part made of an elastic material and disposed to enclose the vertical extension portion of the back cover.

At this time, the vertical extension portion of the back cover may include an uneven portion that is provided to increase a contact area with the molding part, and the uneven portion may be formed in a horizontal direction in order to prevent the upward separation of the molding part.

In addition, the molding part may include an outer vertical portion configured to cover an outer surface of the vertical extension portion of the back cover, an inner vertical portion connected to the outer vertical portion to cover an inner surface of the vertical extension portion, and a horizontal extension portion connected to the inner vertical portion to extend horizontally. A moisture-proof insulating portion formed of an ultraviolet-curable resin material may be disposed on a bottom surface of the display panel, and the moisture-proof insulating portion of the display panel may be seated on the horizontal extension portion of the molding part.

The elastic material of the molding part may be a silicon elastomer having a hardness of 40 to 50 based on a Shore Hardness A Indenter standard, and the gap between the inner vertical portion and the side surface of display panel may be determined between about 0.1 mm and about 0.2 mm, and the thickness of the inner vertical portion may be determined between about 1.0 mm and about 1.2 mm.

In addition, a through hole is provided at a position of the vertical extension portion of the back cover to penetrate the vertical extension portion, and the outer vertical extension portion and the inner vertical portion of the molding part are connected to each other through the through hole in order to prevent the separation phenomenon of the molding part from the back cover.

In addition, the display device may further include a metal inner plate disposed on an inner surface of the back cover and bonded by an adhesive member in order to supplement the rigidity of the back cover and to improve the heat dissipation performance of the back cover.

In addition, the display panel according to the embodiment may include a substrate, a plurality of thin film transistors formed on the substrate, a light emitting layer including an organic light emitting element layer that emits light between opposite electrode layers disposed on one side of the thin film transistors, and an encapsulation layer disposed on one side of the light emitting layer. Further, the display panel may be a bottom emission type organic light emitting display panel configured to emit light of the organic light emitting element layer through the substrate.

According to the aspect of the present disclosure to be described below, by forming a back cover, which is a support structure constituting the display device, in a bent structure, and forming a molding part made of an elastic material to enclose a vertical extension portion, it is possible to prevent the infiltration of foreign matter and the damage of the display panel due to the gap between the display panel and the support structure.

Particularly, by providing an uneven portion or the through hole to the vertical extension portion of the back cover, it is also possible to increase the bonding force between the back cover and the molding part.

In addition, in addition to the configuration in which a vertical extension portion is formed on the back cover which is a back support structure of the display device, by forming an elastic material molding part to enclose the vertical extension portion, and disposing a metal inner plate on the inner surface of the horizontal portion of the back cover, the rigidity of the back cover can be increased, the thickness of the back cover can be decreased, and heat generated from the display panel and the like can be smoothly dissipated.

BRIEF DESCRIPTION OF THE DRAWINGS

The above and other features and advantages of the present disclosure will be more apparent from the following detailed description taken in conjunction with the accompanying drawings, in which.

DETAILED DESCRIPTION

Figure 1:
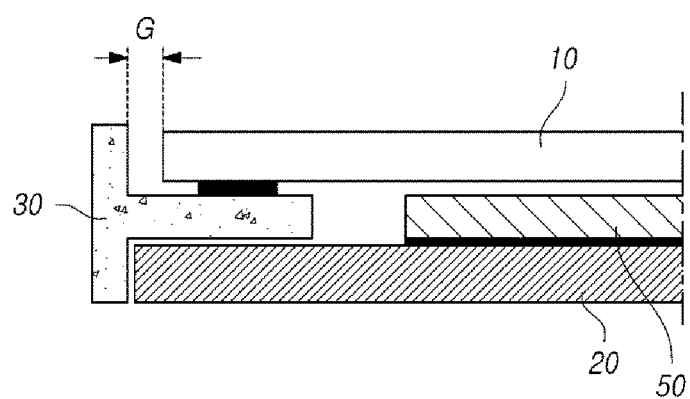
FIG. 1 illustrates a display device support structure according to the related art.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 illustrates a display device support structure according to the related art.

The related art display device of FIG. 1 includes a display panel 10, and includes a back cover 20 and a middle cabinet 30 as a support structure that supports the display panel.

In the embodiment of FIG. 1, the back cover 20 may be made of an advanced composite material (ACM) having a thickness of about 2.5 mm or more so as to secure certain rigidity.

The advanced composite material (ACM) refers to a high performance composite material obtained by combining one of carbon fiber, silicon carbide fiber, aramid fiber, boron fiber, or the like, and a heat resistant resin, such as epoxy resin or polyimide.

At this time, the back cover may be formed by further attaching a thin metal film, such as aluminum, to opposite sides or one side of the ACM material.

In the case of using such a back cover made of the ACM material, since an end portion cannot be shaped by bending due to the characteristic of the material, it is necessary to further include a middle cabinet 30 that protects the side surfaces of the display panel 10 while forming the side appearance of the display device by being coupled to the back cover 20.

That is, the middle cabinet 30 having a T-shaped cross section is coupled with the back cover through an adhesive member 420, such as a double-sided tape or the like in the end region of the flat back cover 20, and the display panel 10 is fixedly bonded to a horizontal support portion of the middle cabinet 30.

In addition, in the structure of FIG. 1, a pad 50 made of a magnetic or non-magnetic material is used on the inner surface of the back cover 20. The magnetic pad 50 may serve to fill a space between the back cover 20 and the display panel 10.

At this time, the middle cabinet 30 herein is expressed by other words, such as a guide panel, a plastic chassis, a p-chassis, a support main, a main support, a mold frame, and the like. The middle cabinet 30 is a rectangular frame-shaped structure having a cross section including a plurality of bent portions.

The middle cabinet 30 is made of a synthetic resin molding material, such as polycarbonate, or a metal material, such as aluminum. The middle cabinet 30 is manufactured through an injection molding method.

In the display device illustrated in FIG. 1, a border gap G, which is a predetermined clearance, is formed between the side surfaces of the display panel and the middle cabinet 30 surrounding the side surfaces of the display panel.

During the operation of the display device, the display panel can expand and contract due to generated heat, external humidity, or the like, and the above-mentioned border gap should be set to about 0.5 mm or more in consideration of the expansion and contraction.

That is, the display panel expands or contracts due to heat or humidity so that the volume of the display panel is changed, and as a result, it is necessary to secure a border gap of a predetermined extent or more in order to accommodate the volume change.

However, the border gap may cause various problems as follows.

First, even though the border gap is set to about 0.5 mm in design, the border gap is changed to about 1.0 mm to 1.2 mm in an actual product in consideration of inter-component tolerance occurring in the manufacturing process. Accordingly, the border gap is easily visible and thus has a bad influence on the external appearance of the product.

In addition, although the border of the display panel is attached to the horizontal support portion of the middle cabinet by double-sided tape or the like, when the bonding force of the double-sided tape or the like is weak or the tape is damaged, moisture or foreign matter may infiltrate into the display device through the large border gap.

There is a possibility that display defects may occur due to the infiltration of foreign matter, and when water infiltrates through the border gap, there is a possibility that an electrical failure, such as an electrical short, may occur in a circuit inside the display device or in the inside of the display panel.

In addition, due to the large border gap, when the display device is exposed to strong vibrations or shocks during transportation, the display panel may move to a certain amount and hit the middle cabinet or the like so that the display panel may be damaged.

In a case in which the border gap is set to be small in order to reduce such a problem, when the display panel or the like expands/contracts due to heat, humidity or the like as described above, the change may not be accommodated, and as a result, the display panel may be damaged.

In addition, in the conventional display device support structure as illustrated in FIG. 1, there is a problem in that it is difficult to perform a forming operation for implementing correct exact dimensions due to the characteristics of the ACM material, and there is a disadvantage in that the thickness of the back cover is relatively large in order to secure sufficient rigidity of the back cover.

In addition, since it is difficult to bend or fold an end portion due to the characteristics of the ACM, which is the material of the back cover 20, a middle cabinet 30 is further required. Accordingly, the number of components and the thickness of the entire display device are increased.

Thus, an aspect of the present disclosure is to solve the above-mentioned various problems by forming the back cover, which supports the back side of the display panel, to include a horizontal portion and a vertical extension portion that is bent and extends from the horizontal portion, and forming an elastic material molding part to enclose the vertical extension portion of the back cover while minimizing a border gap, which is a clearance between the display panel and the molding part.

Herein, the term "horizontal" means a direction that is parallel with an image display surface of the display panel, and the term "vertical" means an image projection direction, i.e., the thickness direction of the display device.

Figure 2:
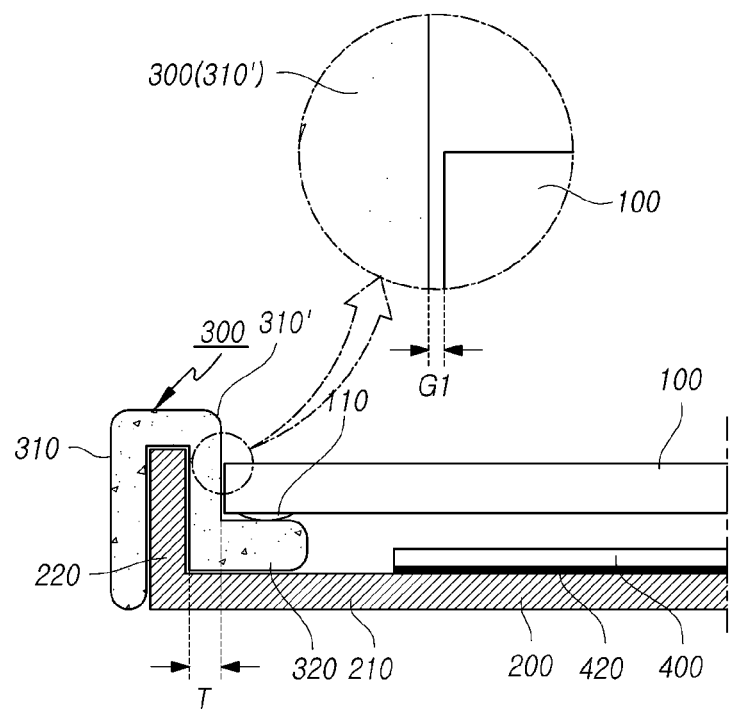
FIG. 2 is a cross-sectional view of a display device according to an aspect of the present disclosure.
Figure 3:
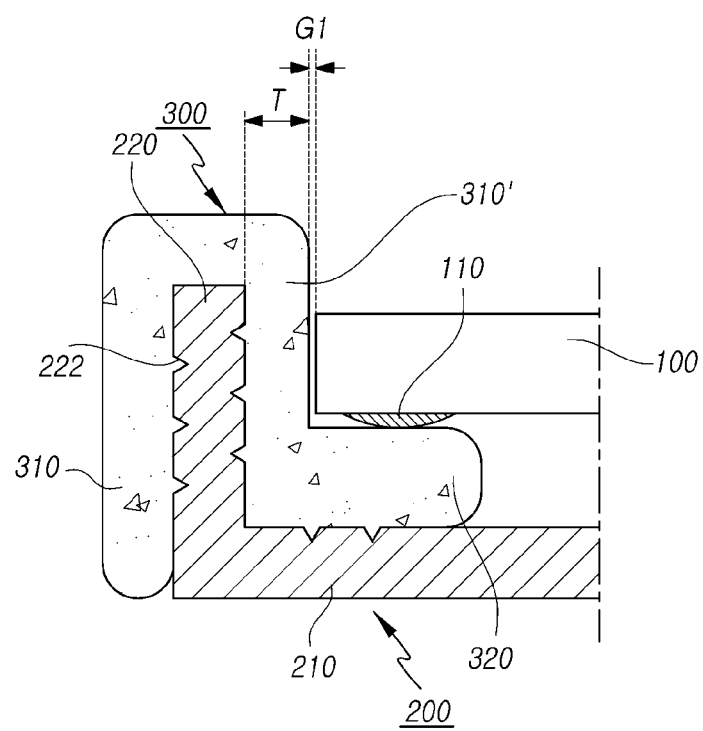
FIG. 3 is an enlarged cross-sectional view of a joint portion between a vertical extension portion of a back cover and a molding part according to the aspect of the present disclosure.

FIG. 2 is a cross-sectional view of a display device according to an aspect of the present disclosure, and FIG. 3 is an enlarged cross-sectional view of a joint portion between a vertical extension portion of a back cover and a molding part according to the aspect of the present disclosure.

As illustrated in FIG. 2, the display device according to the present embodiment includes a display panel 100, a back cover 200 including a horizontal portion 210 that covers the back side of the display panel and a vertical extension portion 220 that is bent to extend from the horizontal portion, and a molding part 300 made of an elastic material and arranged to enclose the vertical extension part 220 of the back cover.

As will be described in more detail below, as illustrated in FIG. 3, the vertical extension portion 220 of the back cover 200 is provided with an uneven portion 222 in order to increase a contact area with the molding part 300.

The uneven portion 222 may be formed on both the inner and outer surfaces of the vertical extension portion of the back cover, and may have a scratched structure having a predetermined directionality or a form of a groove that extends in a predetermined direction.

The uneven portion 222 serves to increase the contact area between the molding part 300 and the vertical extension portion 220 of the back cover so as to increase the bonding force between the molding part and the back cover, and consequently serve to prevent the separation of the molding part from the vertical extension portion of the back cover.

For this purpose, the uneven portion 222 may be formed to extend in the horizontal direction of the display panel.

In addition, in order to prevent the molding part 300 from being separated from the vertical extension part 220 of the back cover, a through hole 230 may be provided at a portion of the vertical extension portion of the back cover to penetrate the vertical extension portion.

The vertical portion and the inner vertical portion of the molding part are connected to each other through the through hole 230 so that it is possible to prevent the molding part 300 from being separated from the vertical extension portion 220 of the back cover.

In addition, as illustrated in FIGS. 2 and 3, the molding part 300 includes an outer vertical portion 310 that covers the outer surface of the vertical extension portion 220 of the back cover 200, an inner vertical portion 310' that is connected to the outer vertical portion and covers the inner surface of the vertical extension portion, and a horizontal extension portion 320 that is connected to the inner vertical extension portion and extends horizontally. The border of the display panel 100 is seated on the horizontal extension portion.

The back cover 200 according to the present embodiment includes the horizontal portion 210 that covers the entire back surface of the display panel and the vertical extension portion 220 that is bent perpendicularly from the horizontal portion to cover the side surface of the display panel, so that the back cover is a plate-shaped member having an L-shaped cross section.

The back cover 200 may be formed of a thermal-conductive metal and a material containing the metal. For example, the back cover 200 may be constituted with a Pre-Coated Material (PCM) that is obtained by coating a polyester resin thereon, or attaching Lami Film or the like to a steel sheet material, such as an Electrolytic Galvanized Iron (EGI) steel sheet, a hot-dip galvanized steel sheet, a galbarium steel sheet, an aluminum-plated steel sheet, an electrogalvanized sheet steel, but it is not limited thereto.

Further, the thickness of the back cover 200 may be about 1.8 mm, but the present disclosure is not limited thereto. When an inner plate 400 to be described later is used, the thickness of the back cover may be made smaller.

That is, a conventional back cover formed to contain the ACM therein as illustrated in FIG. 1 cannot be subjected to a bending process due to the characteristics of the ACM material, but the back cover 200 according to the present embodiment is formed of a metal-based PCM material so that a bending process can be performed on the back cover 200.

Therefore, as illustrated in FIGS. 2 and 3, by forming the vertical extension portion that covers the side surfaces of the display panel by bending the border portion of the back cover, it becomes unnecessary to use a constituent component, such as the middle cabinet as illustrated in FIG. 1.

The vertical extension portion may be provided on all four surfaces of the back cover, but it is not limited thereto, and may be formed on a part of the four surfaces of the back cover according to the layout design of the control circuit and the like.

Meanwhile, the back cover 200 used herein is not limited by the term, but may be referred to as other terms (e.g., a plate bottom, a cover bottom, a base frame, a metal frame, a metal chassis, a chassis base, and an m-chassis), and should be understood as a concept including any type of a frame or a plate-shaped structure disposed on the back side base of the display device as a support for supporting the display panel.

In addition, the term "display device" used herein is used as a concept covering not only a display device, such as a Liquid Crystal Module (LCM) or an Organic Light Emitting Diode (OLED) module that includes, in the narrow sense, a display panel and a driving unit for driving the display panel, but also a set electronic device or a set device, such as a notebook computer, a TV, a computer monitor, or a mobile electronic device (e.g., a smart phone or an electronic pad) that is a complete product including the LCM, the OLED module, or the like.

That is, the term "display device" used herein is used in the sense of including not only a display device, such as an LCM or an OLED module in the narrow sense, but also a set device which is an application product including such a display device.

In this embodiment, a molding part 300 made of an elastic material, such as silicon rubber, is formed to enclose the vertical extension portion of the back cover.

The molding part 300 may be formed by an injection method in which a back cover of a metal material is inserted into a mold, and then an elastic material is injected into the mold and cooled. However, the molding part 300 is not limited thereto.

As illustrated in FIGS. 2 and 3, the molding part 300 includes an outer vertical portion 310 that covers the outer surface of the vertical extension portion 220 of the back cover 200, an inner vertical portion 310' that is connected to the outer vertical portion, and covers the inner surface of the vertical extension portion, and a horizontal extension portion 320 that is connected to the inner vertical extension portion and extends horizontally. The border of the display panel 100 is seated on the horizontal extension portion.

At this time, a moisture-proof insulating portion 110, which may also be referred to as "Tuffy," is formed in the border region of the display panel, and the moisture-proof insulating portion 110 is seated on the horizontal extension portion 320 of the molding part 300.

The moisture-proof insulating portion 110 is used for stably attaching a Chip-On-Film (COF) for applying various signals to a display panel, and formed by coating an ultraviolet-curable resin material along the border of the display panel and ultraviolet curing the resin material.

Since the moisture-proof insulating portion 110 has a sticky physical property, when it is seated on the horizontal extension portion 320 of the silicone rubber molding part as illustrated in FIGS. 2 and 3, it is possible to prevent the display panel from moving even without using a separate adhesive member. Consequently, the double-sided tape or the like used for fixing the display panel as illustrated in FIG. 1 can be removed.

The molding part 300 may be made of an elastic material having a predetermined hardness or less. Specifically, the molding part 300 may be made of a material having a hardness of about 40 to 50 based on a Shore Hardness A Indenter standard.

As described above, the molding part 300 of the present embodiment is formed of a material having a predetermined hardness or less so as to be elastically deformed to a certain extent upon impact, and a silicon elastomer, such as silicone rubber, may be used as the example.

Meanwhile, the inner vertical portion 310' of the molding part faces the side surface of the display panel side, and a gap G1 between the outer surface of the inner vertical portion 310' of the molding part and the side surface of the display panel side may be set to about 0.1 mm to 0.2 mm.

That is, when the gap G1 between the outer surface of the inner vertical portion 310' of the molding part and the side surface of the display panel is set to be smaller than the gap (0.5 mm or more) in the conventional structure illustrated in FIG. 1, the gap G1 is not easily recognized, and as a result, the external appearance of the product can be improved.

In addition, even if the display panel expands due to heat or moisture and comes into contact with the inner vertical portion of the molding part, the inner vertical portion 310' is elastically deformed to a certain extent to absorb the contact impact, so that damage or the like of the display panel, which may be caused due to a movement as illustrated in FIG. 1, can be prevented.

As described above, in order to accommodate the expansion of the display panel, the inner vertical portion 310' of the molding part 300 may have a thickness T of about 1.0 mm or more, but may be maintained at about 1.2 mm or less in order to maintain the width of the bezel at a predetermined value or less.

That is, by determining the thickness T of the inner vertical portion 310' of the molding part 300 to be in the range of about 1.0 mm to 1.2 mm, it is possible to keep a narrow bezel while sufficiently absorbing the shock caused due to the expansion and movement of the display panel.

Meanwhile, it may be advantageous in theory that the gap G1 between the outer surface of the inner vertical portion 310' of the molding part and the side surface of the display panel is closer to 0, but the gap G1 needs to be maintained at about 0.1 mm or more due to a region for a process, such as an assembly process. Further, when the gap G1 is set to about 0.2 mm or more, problems as in the conventional art may still occur.

Therefore, in this embodiment, when the gap G1 between the outer surface of the inner vertical portion 310' of the molding part and the side surface of the display panel is set to about 0.1 to 0.2 mm, the assembly process of the display panel may be facilitated while solving the problems in the conventional structure.

Meanwhile, the width of the outer vertical portion of the molding part 300 may be variably set depending on the bezel width of the entire display device, and the height of the horizontal extension portion 320 of the molding part may be variably set depending on the overall thickness of the display device.

In addition, according to this embodiment, in order to improve the bonding force between the molding part 300 and the back cover 200, which are both injection-molded, the vertical extension portion and the horizontal portion of the back cover may be partially formed with an uneven portion 222.

FIG. 3 is an enlarged cross-sectional view of a joint portion between a vertical extension portion of a back cover and a molding part according to the embodiment of the present disclosure.

As illustrated in FIG. 3, the uneven portion 222 having a predetermined directionality is formed on each of the inner and outer surfaces of the vertical extension portion 220 of the back cover.

The uneven portion 222 may be implemented by scratching the surfaces of the vertical extension portion of the back cover, or by forming grooves extending in a predetermined direction.

At this time, the uneven portion 222 may extend in the horizontal direction, so that the molding part 300 can be effectively prevented from being separated from the vertically extension portion.

Figure 6A:
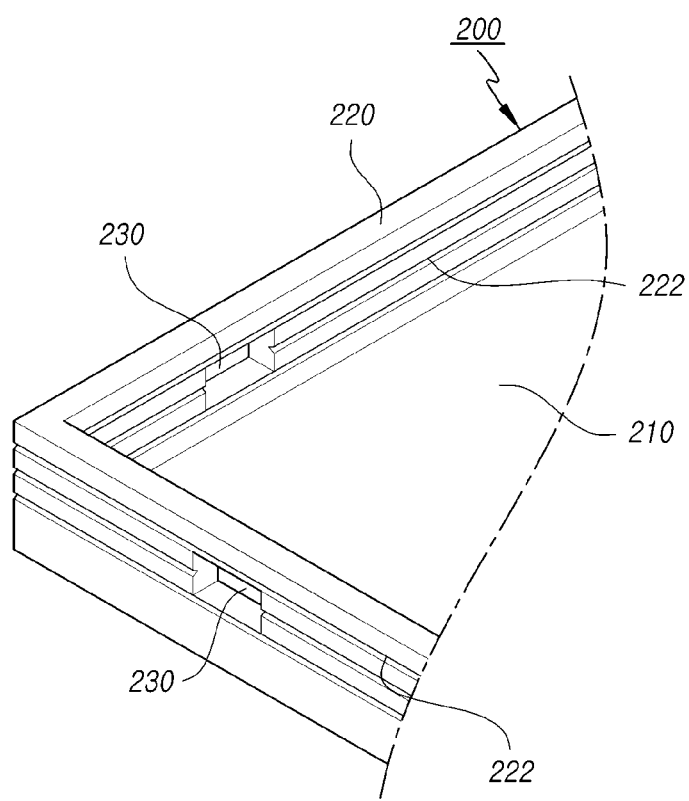
FIG. 6A is a perspective view of the back cover according to the present disclosure.
Figure 6B:
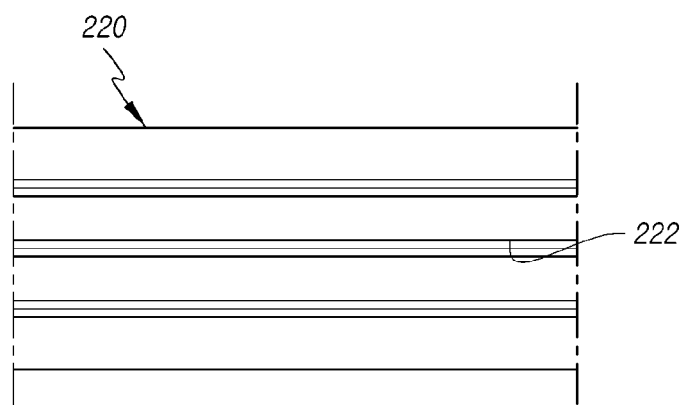
FIG. 6B is a view illustrating an uneven portion formed in the vertical extension portion of the back cover.

That is, as illustrated in FIG. 3 and FIGS. 6A and 6B, since the molding part 300 according to the present embodiment is formed by injection molding on the vertical extension portion of the back cover, which is made of a metal material, an upward separation phenomenon of the molding part from the display device may occur when the coupling force between the two members is weak.

Accordingly, when the uneven portion 222 is formed on at least one of the vertical extension portion and the horizontal portion of the back cover, the area of the back cover to be in contact with the material of the molding part is increased, so that the bonding force between the two members can be increased.

In particular, since the molding part is likely to be separated from the upper portion of the display device, the vertical fixing force of the molding part can be further improved by setting the forming direction or extending direction of the uneven portion 222 to the horizontal direction of the display device as illustrated in FIG. 3 and FIGS. 6A and 6B.

When the uneven portion is formed in the vertical direction, the bonding force is increased due to the increase of the contact area, but when an upward force is applied to the molding part, there may be no effect of suppressing the force.

On the other hand, in the case where the uneven portion 222 is formed in the horizontal direction as in FIG. 3 and FIGS. 6A and 6B, even if the upward force acts on the molding part, the molding part is prevented from being separated upward due to the horizontal uneven portion, and as a result, it is possible to further prevent the separation phenomenon of the molding part.

In addition, in order to further suppress the separation phenomenon of the molding part, a through hole may be provided at a portion of the vertical extension portion of the back cover to penetrate the vertical extension portion.

The detailed configuration of such a through hole will be described in detail below with reference to FIGS. 4 to 6B.

Figure 4:
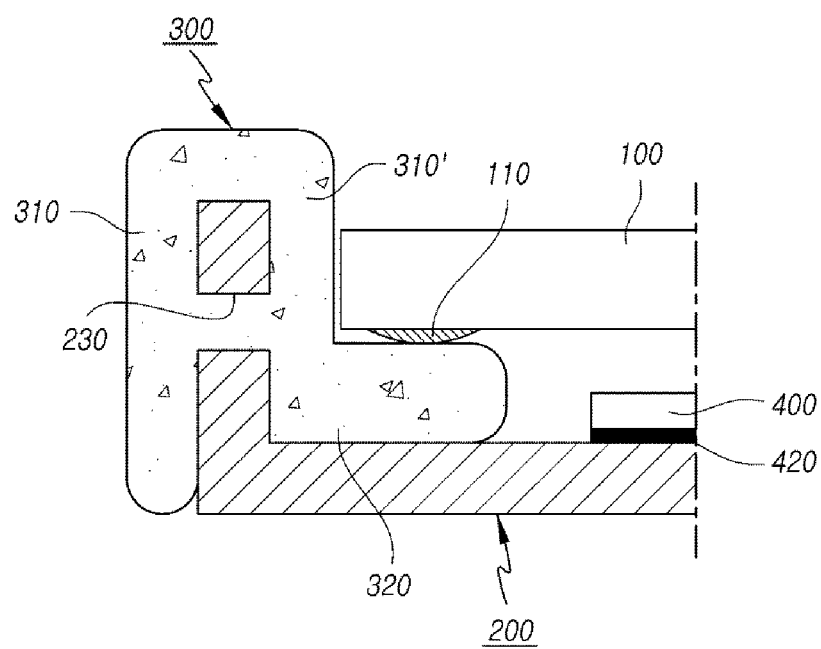
FIG. 4 is an enlarged cross-sectional view of a portion where a through hole is formed in a joint portion between a vertical extension portion of the back cover and a molding part according to the present disclosure.

FIG. 4 is an enlarged cross-sectional view of a portion where a through hole is formed in a joint portion between a vertical extension portion of the back cover and a molding part according to the present embodiment.

In addition, FIG. 6A is a perspective view of the back cover according to the present embodiment, and FIG. 6B is a view illustrating an uneven portion formed in the vertical extension portion of the back cover.

As illustrated in FIG. 4 and FIGS. 6A and 6B, through holes 230 may be formed at predetermined positions in the vertical extension portions of the back cover according to the present embodiment to penetrate the vertical extension portions. The outer vertical portion 310 and the inner vertical portion 310' of the molding part can be connected to each other through the through holes 230.

That is, as illustrated in FIGS. 6A and 6B, when the through holes 230 are formed in the vertical extensions 220 of the back cover and the molding part 300 is injection-molded in this state, the material of the molding part is introduced into the inside of the through holes as in FIG. 4, so that the outer vertical portion 310 and the inner vertical portion 310' of the molding part are connected to each other.

Therefore, even if an upward force is applied to the molding part 300, the upward separation can be basically prevented by the molding portions connected through the through holes.

One or more through hole 230 may be formed in the vertical extension portions of the back cover, and the formation positions thereof will be described in detail with reference to FIG. 5.

Figure 5:
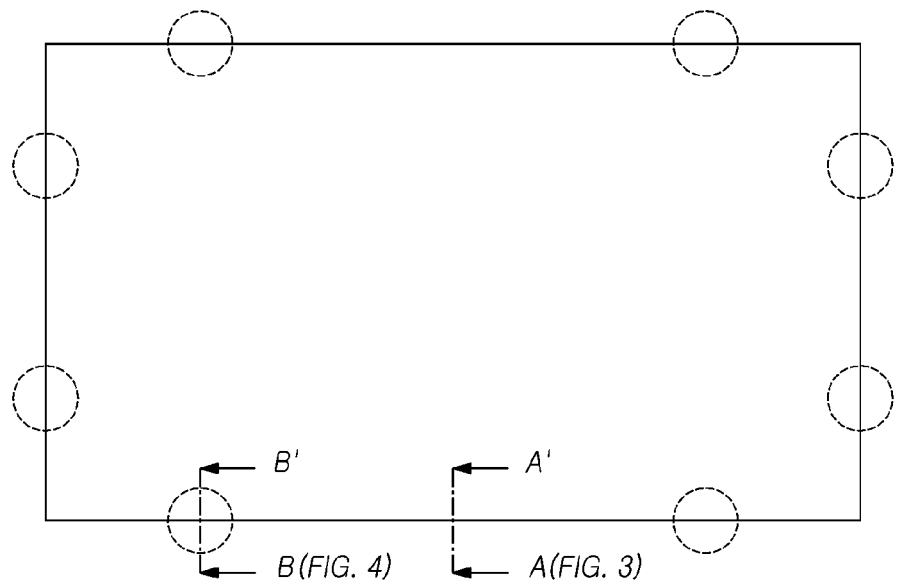
FIG. 5 is a plan view of the display device according to the present disclosure, illustrating an example of a portion where the back cover and the molding part are coupled to each other by through holes.

FIG. 5 is a plan view of the display device according to the present embodiment, illustrating an example of a portion where the back cover and the molding part are coupled to each other through through holes.

A cross-sectional view taken along line A-A' of FIG. 5 corresponds to FIG. 2 and FIG. 3, a cross-sectional view taken along line B-B' of FIG. 5 corresponds to FIG. 4, and the positions indicated by circles in FIG. 5 exemplify regions in which through holes are formed, respectively.

As described above, when one or more through-holes 230 are formed in the vertical extension portion of the back cover, the through holes 230 serve to prevent the separation of the molding part.

However, since a strong force may usually act on the molding part at the corners or edge portions of the display device, two through holes may be formed in each edge portion of the display device as illustrated in FIG. 5.

That is, two through holes are formed on both sides of each corner to provide the through holes in eight regions as a whole. By arranging the through holes as above, it is possible to basically block the upward separation phenomenon of the molding part.

In this case, the shape of the through holes 230 is not limited, and although the shape of the through holes is exemplified as a rectangle, other shapes such as a circle, an ellipse, and the like may be employed.

Also, the size of the through holes 230 is not limited as long as the material of the molding part can be introduced into the through holes 230 and the material of the molding part introduced into the through holes 230 can resist the upward separating force of the molding part.

In addition, the display device according to the present embodiment may further include an inner plate 400 attached to the inner surface of the back cover 200 to supplement the rigidity of the display device support structure and to dissipate heat generated from the display device.

That is, as illustrated in FIG. 2, the inner plate 400, which is a plate-shaped member made of a metal, is attached to the inner surface of the horizontal portion 210 of the back cover 200 through an adhesive member 420, such as a double-sided tape.

The inner plate 400 may be formed of aluminum, an alloy thereof, or any other metal material, but it is not limited thereto and other materials having strength and heat conduction characteristics of a predetermined level or more may be used.

Since the inner plate 400 is a plate-shaped member formed of a material having predetermined strength and thermal conductivity, the inner plate 400 may not only compensate for the flexural rigidity of the back cover or the like, but also may function as a heat sink for absorbing heat emitted from the display panel or a control circuit.

Particularly, in the case where the display panel is an organic light emitting display panel, since the organic light emitting elements are vulnerable to heat, an improvement in heat radiation performance by the inner plate is further required, and will be described in more detail below.

The display panel 100 used for the display device according the present embodiment may be basically any type of display panels, such as a Liquid Crystal Display (LCD) panel, an Organic Light Emitting Diode (OLED) display panel, and a Plasma Display Panel (PDP), and is not limited to a specific display panel as long as the structures of the back cover and the molding part according to the present embodiment can be applied thereto.

However, in the case where the display panel is a liquid crystal display panel, it is necessary to provide a backlight unit, which is configured with a light source, a light guide plate, an optical sheet, and the like, between the display panel and the back cover or the cover bottom, and since a support structure may be further required to support such a backlight unit, the back cover and molding part structure according to the present embodiment may be less likely to be applied.

Further, since the liquid crystal material is more heat-resistant than the organic light emitting material to be described below, the usability of the inner plate used in this embodiment may be somewhat low.

On the other hand, in the case of an organic light emitting (OLED) display panel, the structure of the back cover, the molding part, and the inner plate according to the present embodiment can be easily applied because the display panel is in a single assembly type in which a plurality of layers, such as a light emitting panel layer as a glass substrate including an organic light emitting element and a thin film transistor (TFT) and an encapsulation layer, are laminated as a single panel, and a back light unit, such as a separate light source, is not required because the organic light emitting element to be used is a self light-emitting element.

In addition, because an organic light emitting element or an organic light emitting material used in an organic light emitting display panel is vulnerable to heat compared with the liquid crystal material, and the heat dissipation of the display device becomes more important, the inner plate according to the present embodiment is more highly required.

Therefore, it may be desirable that the display panel 100 according to the present embodiment is an OLED display panel.

Figure 7A:
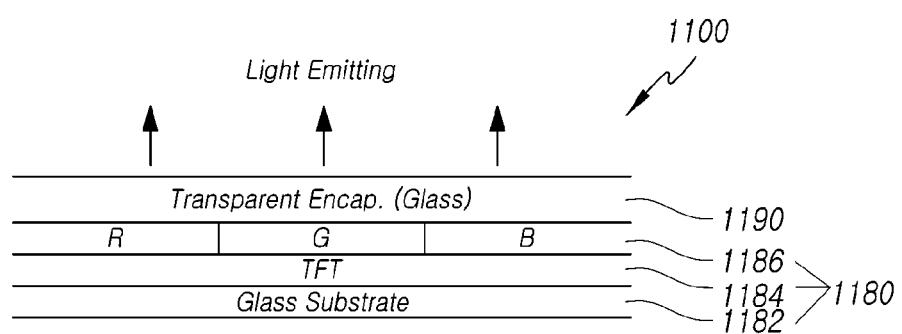
FIGS. 7A to 7C illustrate various cross-sectional structures of an organic light emitting display panel used in the display device according to the present disclosure.
Figure 7B:
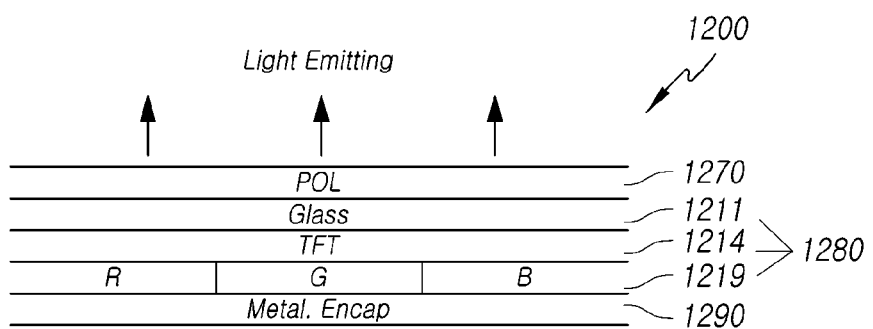
Figure 7C:
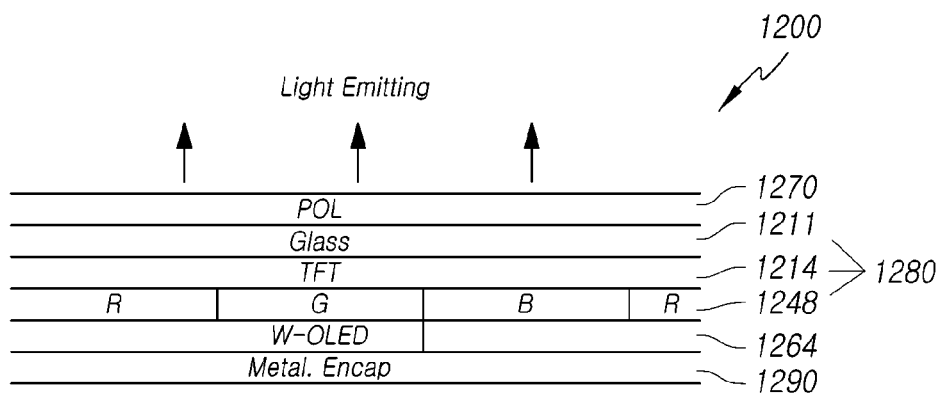

FIGS. 7A to 7C illustrate various cross-sectional structures of an organic light emitting display panel used in the display device according to the present embodiment.

As described above, the display panel used for the display device to which the present embodiment is applied may include any types of display panels, such as a liquid crystal display panel and an organic light emitting display panel. However, in consideration of the fact that the heat dissipation characteristic is important because a backlight unit is not required and the light emitting element is vulnerable to heat, it may be more advantageous to apply the present embodiment to a display device having an organic light emitting display panel.

The organic light emitting display panel 100, which may be used in the present embodiment, may include a substrate, a plurality of thin film transistors formed on the substrate, a light emitting layer including an organic light emitting element layer that emits light between both electrode layers disposed on one side of the thin film transistors, and an encapsulation layer disposed on one side of the light emitting layer.

Meanwhile, the organic light emitting display panel may be classified into a top emission type and a bottom emission type depending on the direction in which the light from the organic light emitting element layer travels, and the present embodiment may use an OLED display panel based on the bottom emission type.

In the top emission type, light generated from the organic light emitting element layer travels in an upward direction, which is a direction opposite to the substrate of the light emitting layer, and the surface in the direction opposite to the substrate becomes an image display surface.

On the contrary, in the bottom emission type, light generated from the organic light emitting element layer travels toward the substrate of the light emitting layer and is emitted through the substrate, and at this time, the outer surface of the substrate of the light emitting layer becomes an image display surface.

FIG. 7A is a cross-sectional view of a top emission type display panel in which light is emitted toward a thin film transistor (TFT) with reference to a substrate of a light emitting layer in an OLED display panel.

As illustrated in FIG. 7A, a top emission type OLED display panel 1100 may include a light emitting layer 1180 and an encapsulation layer 1190 disposed on one side of the light emitting layer to protect the light emitting layer.

The light emitting layer 1180 is an array substrate unit including a organic self light-emitting element layer, and is formed by sequentially stacking a glass substrate 1182, a layer of a plurality of TFTs 1184 formed on the glass substrate 1182, and an organic light emitting element layer 1186 disposed on one side of the thin film transistor layer.

Although not illustrated, a first electrode (anode or cathode) and a second electrode (cathode or anode) connected to the source or drain electrode of each thin film transistor are disposed, and the organic light emitting element layer 1186 is disposed between both electrode layers.

The organic light emitting device emits light by self light-emission according to the potential difference generated between the opposite electrodes by the switching operation of the thin film transistor.

Meanwhile, of the opposite surfaces of the light emitting layer, in the direction where the glass substrate is disposed, there is no problem because the substrate made of a glass prevents moisture, foreign matter, or the like from infiltrating from the outside, but it is required to protect the surface in the opposite direction of the glass substrate, i.e., in the direction where the organic light emitting display layer is formed, because moisture, foreign matter, or the like may infiltrate into the surface from the outside.

The encapsulation layer 1182 is a protective layer used for this purpose, and is bonded to the top surface of the organic light emitting element layer of the light emitting layer to as to prevent the organic light emitting elements from being damaged.

In this specification, the encapsulation layer is not limited to the term, but should be understood as a concept including all kinds of protective layers arranged to protect an organic light emitting device layer of a light emitting layer that constitutes an OLED display panel. The encapsulation layer may be expressed by other terms, such as protective layer and second substrate layer.

Meanwhile, as illustrated in FIG. 7A, in the top emission type, light is emitted in a direction opposite to the glass substrate 1182 of the light emitting layer, and an image display surface is formed in that direction. The encapsulation layer 1190 is formed on the outer surface in the image display surface direction, i.e., directly outside the organic light emitting element layer 1186.

In addition, as illustrated in FIG. 7A, in the top emission type, because the encapsulation layer 1190 is disposed on the image display surface side, the encapsulation layer should be transparent, and as a result, the encapsulation layer should be formed of a glass material or the like. In addition, in the top emission type, because the encapsulation layer 1190 forms an image display surface exposed to an observer, it is necessary for the encapsulation layer 1190 to have rigidity of a predetermined level or more to resist external impact or the like.

Therefore, in the top emission type, the encapsulation layer 1190 should be formed of a glass layer having a relatively thick first thickness T1, and in a large TV or the like, the first thickness T1 of the encapsulation layer 1190 should be about 1 mm or more.

FIGS. 7B and 7C are cross-sectional views illustrating a bottom emission type organic light emitting display panel. FIG. 7B illustrates a case where a glass light emitting layer is applied for each color, and FIG. 7C illustrates a case where a white organic light emitting layer (WOLED). In the following, FIG. 7B will be described as a representative example.

As illustrated in FIG. 7B, an organic light emitting display panel 1200, which may be used for a display device according to an embodiment of the present disclosure, may include an encapsulation layer 1290, a light emitting layer 1280 disposed on the encapsulation layer, and a polarizing layer 1270 disposed on the light emitting layer.

The light emitting layer 1280 means an array substrate unit including a organic self light-emitting element layer, and is formed by sequentially stacking a glass substrate 1211, a layer of a plurality of TFTs 1214 formed on the glass substrate 1211, and an organic light emitting element layer 1219 disposed on one side of the thin film transistor layer.

Figure 8:
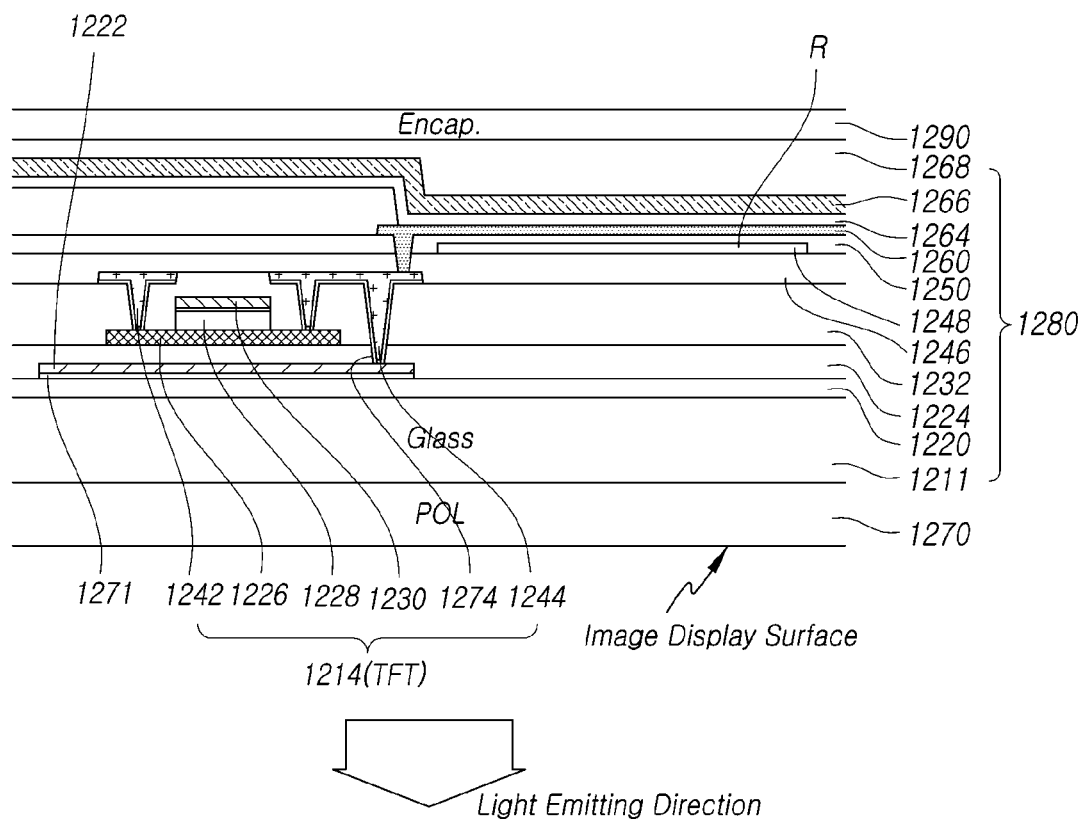
FIG. 8 is a detailed cross-sectional view illustrating a laminated structure of a bottom emission type organic light emitting display panel applied by the present disclosure.

Although not illustrated in more detail in FIG. 8, a first electrode (anode or cathode) and a second electrode (cathode or anode) connected to the source or drain electrode of each thin film transistor are disposed, and the organic light emitting element layer 1219 is disposed between both electrode layers.

The organic light emitting device emits light by self light-emission according to the potential difference generated between the opposite electrodes by the switching operation of the thin film transistor.

At this time, one surface of the polarizing layer 1270 becomes an image display surface on which an image is displayed, and a polarizing layer 1270, a light emitting layer 1280, and an encapsulation layer 1290 are sequentially arranged below the image display surface. The polarizing layer 1270 may not be included in some cases.

Meanwhile, FIG. 7B exemplifies a case where an organic light emitting material that outputs light of each of the colors (R, G, B) is used for the organic light emitting element layer 1219 constituting the light emitting layer 1280, and FIG. 7C illustrates an example in which the organic light emitting element layer is a white organic light emitting element layer 1264 that emits white light and includes a color filter layer 1248 disposed on the white organic light emitting element layer.

As illustrated in FIGS. 7B and 7C, in the bottom emission type OLED display panel 1200, the light emitting layer 1280 includes a substrate 1211, a thin film transistor layer 1214, and an organic light emitting element layer 1219 that are sequentially arranged below the image display surface.

In this state, the light emitted from the organic light emitting element layer passes through the thin film transistor layer 1214 and the substrate 1211. Therefore, assuming that the substrate 1211 is on the lower side (bottom side), it is expressed as the bottom emission type in which light is emitted toward the substrate.

In this bottom emission organic light emitting display panel 1200, the encapsulation layer 1290 is disposed adjacent to the organic light emitting element layer 1219 in order to protect the organic light emitting element layer 1219.

Accordingly, the top emission type encapsulation layer (1190 in FIG. 7A) is disposed at the image display surface side. On the contrary, in the bottom emission type as in FIGS. 7B and 7C, because the encapsulation layer 1290 is disposed on the opposite side to the image display surface, it is not necessary for the encapsulation layer 1290 to be made of a transparent material, and rigidity is not required to an extent to protect against external impact as well.

That is, it is sufficient that the encapsulation layer 1290 in the bottom emission type has only a function of preventing moisture, foreign matter, or the like from infiltrating into the organic light emitting element layer of the light emitting layer 1280.

Accordingly, the encapsulation layer 1290 of the OLED display panel according to the present embodiment may be implemented with a metallic material thin film having a second thickness T2 smaller than the first thickness T1 of the above-described top emission type encapsulation layer 1190.

In fact, the second thickness of the encapsulation layer 1290 of the OLED display panel according to the present embodiment may be about 0.05 mm to 0.2 mm.

In addition, the material of the encapsulation layer 1290 of the OLED display panel according to the present embodiment is not limited to the metal, and there is no limit in material as long as the material can protect the organic light emitting element layer and can be formed as a thin film.

However, in order to prevent hydrogen, oxygen, and the like from infiltrating into the organic light emitting element layer 1219 to oxidize the organic light emitting elements, the encapsulation layer 1290 may be formed of an iron-nickel alloy, so-called Invar metal material, that prevents permeation of hydrogen/oxygen.

In addition, the encapsulation layer 1290 may be formed of a metal material having a reflection characteristic of a predetermined level or more.

This is due to the fact that since the light emitted from the organic light emitting element layer 1219 should be output to the image display surface opposite to the encapsulation layer 1290, the encapsulation layer 1290 has a function of a reflection plate to be capable of improving the light efficiency of the display panel when the encapsulation layer 1290 is formed of a metal material having a reflection characteristic of a predetermined level or more.

That is, this is due to the fact that, as illustrated in FIGS. 7B and 7C, since the light emitted from the organic light emitting element layer 1219 should be output to the image display surface opposite to the encapsulation layer 1290, the encapsulation layer 1290 has a function of a reflection plate to be capable of improving the light efficiency of the display panel when the encapsulation layer 1290 is formed of a metal material having a reflection characteristic of a predetermined level or more.

As described above, when a bottom emission type OLED display panel is used according to the embodiment of the present disclosure, the thickness of the encapsulation layer can be reduced and the light efficiency of the display panel can be improved according to the reflection characteristic of the encapsulation layer 1290, compared with the top emission type as illustrated in FIG. 7A.

Meanwhile, unlike the example illustrated in FIG. 7B in which a glass light emitting layer is applied for each color, FIG. 7C illustrates an example in which the organic light emitting device layer is a White Organic Light Emitting Device (WOLED) layer 1264 that emits white light, and includes a color filter layer 1248 disposed on the WOLED layer.

Since the light efficiency of an WOLED is generally superior to that of other respective color organic light emitting devices, the light efficiency of the OLED display device can be further improved when the structure illustrated in FIG. 7C is used.

FIG. 8 is a detailed cross-sectional view illustrating a laminated structure of a bottom emission type OLED display panel that may be used in an embodiment of the present disclosure.

For convenience, FIG. 8 illustrates the laminated structure in a state where the light emitting direction or the image display surface faces downward opposite to FIGS. 7A to 7C.

As illustrated in FIG. 8, a polarizing layer 1270 is disposed on the image display surface side, a light emitting layer 1280 is laminated on the polarizing layer 1270 to be in contact with the polarizing layer 1270, and the encapsulation layer 1290 is disposed on one surface of the light emitting layer 1280.

A detailed configuration of the light emitting layer 1280 of the bottom emission type OLED display panel used in this embodiment will be described below.

A buffer layer 1220, a light shielding layer 1222, a first interlayer insulating film 1224, a semiconductor layer 1226, a gate insulating film 1228, a gate electrode 1230, a second interlayer insulating film 1232, a source electrode 1242, a drain electrode 1244, a third interlayer insulating film 1246, a color filter 1248, a planarization layer 1250, a first electrode 1260, a bank, an organic light emitting diode layer 1264, a second electrode 1266, a passivation layer 1270, and the like may be disposed on the substrate 1211 of the light emitting layer 1280.

Meanwhile, the substrate 1211 of the light emitting layer 1280 may be a glass substrate, but is not limited thereto. The substrate 1211 may be a plastic substrate that includes PET (polyethylene terephthalate), PEN (polyethylene naphthalate), polyimide, or the like.

The buffer layer 1220 is provided to block the infiltration of impurity elements on the substrate 1211 or to improve an interface characteristic or flatness, and may be formed in a single layer or a plurality of layers of silicon nitride ($SiN_x$), silicon oxide ($SiO_x$), or the like.

The light shielding layer 1222 is provided to block light incident on a channel region of the semiconductor layer 1226. For this purpose, the light shielding layer 1222 may be formed of an opaque metal layer. Also, the light shielding layer 1222 may be electrically connected to the drain electrode 1244 to prevent parasitic capacitance.

The interlayer insulating film 1224 insulates the light shielding layer 1222 and the semiconductor layer 1227 from each other. The first interlayer insulating film 1224 includes an insulating material, and may be stacked on the buffer layer 1220 and the light shielding layer 1222.

The semiconductor layer 1226 includes silicon (Si) and is disposed on the first interlayer insulating film 1224, and may include an active region that constitutes a channel, and a source region and a drain region that are doped with a high concentration of impurities on the opposite sides of the active region.

The gate insulating film 1228 insulates the semiconductor layer 1226 and the gate electrode 1230 from each other. The gate insulating film 1228 includes an insulating material, and may be stacked on the semiconductor layer 1226.

The gate electrode 1230 is disposed on the gate insulating film 1228, and is supplied with a gate voltage from a gate line.

The second interlayer insulating film 1232 protects the gate electrode 1230, and insulates the gate electrode 1230, the source electrode 1242, and the drain electrode 1244 from each other. The second interlayer insulating film 1232 includes an insulating material, and may be stacked on the first interlayer insulating film 1224, the semiconductor layer 1226, and the gate electrode 1230.

Each of the source electrode 1242 and the drain electrode 1244 is disposed on the second interlayer insulating film 1232 and may come in contact with the semiconductor layer 1226 through first and second contact holes formed in the second interlayer insulating film 1232. Also, the drain electrode 1244 may come in contact with the light shielding layer 1222 through the third contact hole.

Here, the source electrode 1242 and the drain electrode 1244, the semiconductor layer 1226, which is in contact with these electrodes, the gate insulating film 1228 and the gate electrode 1230, which are formed on the semiconductor layer 1226 may constitute the thin film transistor layer 1214.

The third interlayer insulating film 1246 protects the source electrode 1242 and the drain electrode 1244.

The color filter 1248 may be disposed on the second interlayer insulating film 1232 at a position to be superimposed on the organic light emitting element layer 1216 so as to change the color of light emitted toward the substrate 1211 in the bottom emission type.

The planarization layer 1250 protects the source electrode 1242 and the drain electrode 1244, and may flatten the surface on which the first electrode 1260 is disposed.

The first electrode 1260 may be disposed on the planarization layer 1250, and may come in contact with the drain electrode 1244 through a fourth contact hole formed in the planarization layer 1250. In addition, the first electrode 1260 serves as an anode electrode, and may be formed of a transparent conductive material having a relatively large work function value so as to allow light generated from the organic light emitting element layer 1264 to transmit therethrough.

For example, the first electrode 1260 may be formed of a metal oxide, such as ITO (Indium Tin Oxide) or IZO (Indium Zinc Oxide), a mixture of a metal and an oxide, such as ZnO:Al or SnO2:Sb, a conductive polymer, such as poly(3-methyl thiophene), poly[3,4-(ethylene-1,2-dioxy) thiophene] (PEDT), polypyrrole and polyaniline, and the like. In addition, the first electrode 1260 may be formed of a Carbon Nano Tube (CNT), a graphene, a silver nano wire, or the like.

The organic light emitting element layer 1264 is disposed on the first electrode 1260, and may be constituted with a single layer formed of a light emitting material or may be constituted with multiple layers of a hole injecting layer, a hole transporting layer, a light emitting layer, an electron transporting layer, and an electron injection layer. The organic light emitting element layer 1264 may be a WOLED layer that outputs white light, and may be applied to the entire surface without being patterned. Since the patterning step of the organic light emitting element layer 1264 may be omitted, the manufacturing process can be simplified or costs can be reduced.

The second electrode 1266 is disposed on the organic light emitting element layer 1264, and may be formed of a conductive material having a relatively low work function value as a cathode electrode (negative pole). Here, the second electrode 1266 may be formed of a single layer of Ag, a single alloy layer containing Mg or the like in a predetermined ratio, or a plurality of layers thereof, depending on the bottom emission type.

The first electrode 1260 connected to the thin film transistor, the second electrode 1266 disposed opposite to the first electrode 1260, and the organic light emitting element layer 1264 interposed between the first electrode 1260 and the second electrode 1266 may be collectively referred to as an organic light emitting device.

When a predetermined voltage is applied to the first electrode 1260 and the second electrode 1266, holes injected from the first electrode 1260 and the electrons provided from the second electrode 1266 are transported to the organic light emitting element layer 1264 to form an exciton, and when the exciton is transited from the excited state to the ground state, light may be generated to be emitted in the form of visible light.

The bank may be formed on the border of the first electrode 1260 and may have an opening to expose the first electrode 1260. Such a bank may be formed of an inorganic insulating material, such as SiOx, SiNx, or SiON.

The passivation layer 1270 serves to protect an organic layer from moisture and oxygen, and may have a multilayer structure of an inorganic material, an organic material, and a mixed material thereof.

Meanwhile, one low-reflection layer 1271 may be formed on each of the light-shielding layer 1222, the gate electrode 1230, the source electrode 1242, and the drain electrode 1244. The low-reflection layer may prevent the reflection of external light, thereby preventing problems, such as deterioration of visibility, reduction in luminance, and reduction in contrast ratio characteristic.

The low-reflection layer 1271 may be formed of a material that absorbs external light introduced through the substrate 1211, or may be coated with a light absorbent. Here, the external light may mean non-polarized light which did not pass through a polarizing plate, a polarizing layer, or the like.

The material that absorbs external light may be formed of a metal that absorbs light or an alloy thereof, and may have a black-based color. For example, the low-reflection layer 1271 may be formed of any one of, or a combination of, molybdenum (Mo), chromium (Cr), titanium (Ti), niobium (Nb), manganese (Mn), and tantalum (Ta). However, the embodiments are not limited thereto, and may be formed of other metals capable of absorbing light. Accordingly, the low-reflection layer 1271 may prevent the external light from being reflected back to the outside.

Further, the low-reflection layer 1271 is made of a metal oxide or an alloy of a metal, and a metal oxide that absorbs light, and may block light introduced from the outside. The low-reflection layer 1271 may be made of a metal oxide, such as Indium Tin Oxide (ITO), Indium Zinc Oxide (IZO), or Indium Tin Zinc Oxide (ITZO). Since the light reflected from the surface of the low-reflection layer 1271 and the light reflected from the interface between the conductive layer and the low-reflection layer 1271 after passing through the low-reflection layer 1271 cause compensating interference with each other, the external light may not go out again.

Meanwhile, the OLED display panel 1200 according to the present embodiment may further include a transmissivity adjusting film (not illustrated) and/or a transparent multilayer film (not illustrated) disposed on one surface of the substrate 1211 to absorb light having a wavelength in a visible region.

The transmissivity adjusting film absorbs light incident from the outside to the substrate 1211, and functions to significantly reduce the reflectivity of the substrate 1211 through absorption of external light with a predetermined transmissivity.

The transparent multilayer film has a structure in which a plurality of refractive layers are laminated in a state in which mutually adjacent layers have different refractive indices, and functions to extinguish external light by the compensate interference between the light reflected from the refractive layers having different refractive indices, thereby reducing the reflectivity of the external light.

The transmissivity adjusting film and/or the transparent multilayer film may constitute the above-described polarizing layer 1270 itself or a portion thereof.

As described above, according to aspects of the present disclosure, by forming a back cover, which is the support structure constituting the display device, in a bent structure and forming a molding part made of an elastic material to enclose the vertical extension portion, a border gap, which is a clearance between the side surfaces of the display panel and the side surface support structure, can be minimized to maintain an excellent external appearance of the display device, and to prevent the infiltration of foreign matter and damage of the display panel which may caused due to the gap between the display panel and the support structure.

Particularly, by providing an uneven portion or the through hole to the vertical extension portion of the back cover, it is also possible to increase the bonding force between the back cover and the molding part, and to prevent an upward separation phenomenon of the molding part.

In addition, in addition to the configuration in which a vertical extension portion is formed on the back cover which is a back support structure of the display device, a molding part is formed of an elastic material to enclose the vertical extension portion, by disposing a metal inner plate on the inner surface of the horizontal portion of the back cover, the rigidity of the back cover can be increased, the thickness of the back cover can be decreased, and heat generated from the display panel and the like can be smoothly dissipated.

Further, with the above-described configuration and by using a bottom emission type OLED display panel, the thickness of the encapsulation layer can be reduced compared with the top emission type, and the light efficiency of the display panel can be improved according to the reflection characteristic of the encapsulation layer.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:
1. A display device comprising:
a display panel including an image display side, a rear side and a lateral side;
a back cover including a horizontal portion parallel with the image display side of the display panel and configured to cover the rear side of the display panel, and a vertical extension portion parallel with and configured to cover the lateral side of the display panel and having an inner side surface, an outer side surface and a top surface connecting the inner side surface and the outer side surface, and vertically extended from the horizontal portion; and
a molding part made of a single material with an elastic material and including an inner vertical portion, an outer vertical portion, a connecting portion and a horizontal extension portion,
wherein the connecting portion of the molding part is disposed between the inner vertical portion and the outer vertical portion and directly connecting the outer vertical portion and the inner vertical portion, and the horizontal extension portion of the molding part is extended from the inner vertical portion and in parallel with the image display side of the display panel,
wherein the inner vertical portion, the outer vertical portion and the connecting portion of the molding part are respectively in contact with the inner side surface, the outer side surface and the top surface of the vertical extension portion of the back cover, and the inner vertical portion and the outer vertical portion of the molding part are respectively disposed inside and outside the vertical extension portion of the back cover, and wherein the vertical extension portion of the back cover has a through hole penetrating the vertical extension portion, and the outer vertical portion and the inner vertical portion of the molding part are connected to each other by the through hole.

2. The display device of claim 1, wherein the vertical extension portion of the back cover includes an uneven portion that is provided to increase a contact area with the molding part.

3. The display device of claim 2, wherein the uneven portion extends in a horizontal direction.

4. The display device of claim 3, wherein an edge of the display panel is disposed on the horizontal extension portion.

5. The display device of claim 1, wherein the elastic material of the molding part includes silicon elastomer having a hardness of about 40 to 50 based on a Shore Hardness A Indenter Standard.

6. The display device of claim 1, wherein the inner vertical portion and the side of the display panel has a gap of about 0.1 mm to 0.2 mm, and the inner vertical portion has a thickness of about 1.0 mm to 1.2 mm.

7. The display device of claim 1, further comprising:
a moisture-proof insulating portion disposed on a bottom surface of the edge of the display panel.

8. The display device of claim 7, wherein the moisture-proof insulating portion is formed of an ultraviolet-curable resin material and is disposed on the horizontal extension portion of the molding part.

9. The display device of claim 7, wherein the moisture-proof insulating portion has a sticky physical property.

10. The display device of claim 7, wherein the moisture-proof insulating portion attaches a chip-on-film for applying various signals to the display panel.

11. The display device of claim 1, further comprising:
a metallic inner plate disposed on an inner surface of the back cover.

12. The display device of claim 11, therein the metallic inner plate is engaged by an adhesive member.

13. The display device of claim 1, wherein the display panel comprises a substrate, a plurality of thin film transistors disposed at the substrate, a light emitting layer including an organic light emitting element layer that emits light between opposite electrode layers disposed on one side of the thin film transistors, and an encapsulation layer disposed on a side of the light emitting layer,
wherein the display panel is a bottom emission type organic light emitting display panel configured to emit light of the organic light emitting element layer through the substrate.

14. The display device of claim 1, wherein the outer vertical portion is longer that the inner vertical portion.

15. A display device comprising:
a display panel including an image display side, a rear side and a lateral side;
a back cover having a horizontal portion parallel with the image display side of the display panel and covering the rear side of the display panel, and a vertical extension portion parallel with and covering the lateral side of the display panel and having an inner side surface, an outer side surface and a top surface connecting the inner side surface and the outer side surface, and vertically extended from the horizontal portion; and
a panel protecting part having first and second vertical segments, a connecting segment and a horizontal segment, and the connecting segment disposed between the first and second vertical segments and directly connecting the first and second vertical segments,
wherein the first and second vertical segments, the connecting segment and the horizontal segment are made of a same material,
wherein the first and second vertical segments are parallel with the vertical extension portion of the back cover and in contact with the vertical extension portion of the back cover, the connecting segment is parallel with the horizontal portion of the back cover and horizontally extended from the second vertical segment that fills a gap between the display panel and the vertical extension portion of the back cover, and the first and second vertical segments of the panel protecting part are respectively disposed outside and inside the vertical extension portion of the back cover, and
wherein the vertical extension portion of the back cover has a through hole penetrating the vertical extension portion, and the first vertical segment and the second vertical segment of panel protecting part are engaged with each other by the through hole.

16. The display device of claim 15, wherein the horizontal portion and the vertical extension portion of the back cover and the panel protecting part are engaged by uneven surfaces.

17. The display device of claim 15, further comprising a moisture-proof insulating portion tightening a gap between the horizontal segment of the panel protecting part and an edge of the display panel.

18. The display device of claim 15, further comprising a metallic inner plate disposed on an inner surface of the back cover.

* * * * *